United States Patent
Arimoto et al.

(10) Patent No.: US 10,761,220 B2
(45) Date of Patent: Sep. 1, 2020

(54) LAMINATED SCINTILLATOR PANEL

(71) Applicant: Konica Minolta, Inc., Tokyo (JP)

(72) Inventors: Tadashi Arimoto, Hino (JP); Kei Isoda, Tokyo (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 15/624,426

(22) Filed: Jun. 15, 2017

(65) Prior Publication Data

US 2017/0363753 A1    Dec. 21, 2017

(30) Foreign Application Priority Data

Jun. 16, 2016   (JP) .................... 2016-119665

(51) Int. Cl.

| | | |
|---|---|---|
| *G01T 1/202* | (2006.01) | |
| *H01L 27/146* | (2006.01) | |
| *G21K 4/00* | (2006.01) | |
| *G01N 23/041* | (2018.01) | |
| *G01T 1/20* | (2006.01) | |

(52) U.S. Cl.
CPC ............ *G01T 1/202* (2013.01); *G01N 23/041* (2018.02); *G01T 1/2002* (2013.01); *G21K 4/00* (2013.01); *H01L 27/14663* (2013.01); *G01N 2223/505* (2013.01); *G21K 2004/04* (2013.01)

(58) Field of Classification Search
CPC .......... G01T 1/20; G01T 1/2012; G21K 4/00; G21K 2004/04; H01L 27/14663; H01L 31/02322
USPC ................... 250/361 R, 370.11, 483.1, 484.4
See application file for complete search history.

(56) References Cited

U.S. PATENT DOCUMENTS

| | | | | |
|---|---|---|---|---|
| 3,225,193 | A * | 12/1965 | Hilton ..................... | G01T 1/20 |
| | | | | 250/227.28 |
| 2004/0099810 | A1* | 5/2004 | Gerstenmayer ......... | H01J 47/02 |
| | | | | 250/389 |
| 2007/0040125 | A1* | 2/2007 | Sato .................. | H01L 27/14663 |
| | | | | 250/367 |
| 2009/0134334 | A1* | 5/2009 | Nelson .................. | G01T 1/2002 |
| | | | | 250/361 R |
| 2010/0081947 | A1* | 4/2010 | Suzuki .................. | A61B 5/024 |
| | | | | 600/500 |

(Continued)

FOREIGN PATENT DOCUMENTS

| | | | |
|---|---|---|---|
| WO | WO 2014/080941 A1 | 5/2014 | |
| WO | WO 2014/198644 A1 | 12/2014 | |

OTHER PUBLICATIONS

Rutishauser et al., "Structured scintillator for hard x-ray grating interferometry" Applied Physics Letters 98, Apr. 27, 2011.

(Continued)

*Primary Examiner* — Blake C Riddick
(74) *Attorney, Agent, or Firm* — Baker Hostetler

(57) ABSTRACT

A laminated scintillator panel having a structure in which a scintillator layer for converting radiation into visible light and a non-scintillator layer are repeatedly laminated in a direction parallel to an incident direction of radiation, wherein the non-scintillator layer transmits the visible light. Provided is a lattice-shaped laminated scintillator panel with high luminance, a large area, and a thick layer by means completely different from a conventional technique using a silicon wafer.

6 Claims, 2 Drawing Sheets

(56) References Cited

U.S. PATENT DOCUMENTS

| | | | |
|---|---|---|---|
| 2010/0091947 A1* | 4/2010 | Niu | A61B 6/00 378/63 |
| 2011/0291014 A1* | 12/2011 | Kusner | G01T 1/20 250/362 |
| 2013/0322598 A1* | 12/2013 | Saruta | G01T 1/2006 378/62 |
| 2014/0301527 A1* | 10/2014 | Morimoto | G01T 1/2002 378/4 |
| 2015/0117599 A1* | 4/2015 | Yun | A61B 6/502 378/36 |
| 2015/0241579 A1* | 8/2015 | Menge | G01V 5/0091 250/368 |
| 2015/0243397 A1* | 8/2015 | Yun | G01N 23/20075 378/36 |
| 2015/0260663 A1* | 9/2015 | Yun | G01N 23/20075 378/36 |
| 2015/0309190 A1* | 10/2015 | Kinoshita | G01T 1/2018 250/486.1 |
| 2017/0279247 A1* | 9/2017 | Logunov | G02F 1/133603 |
| 2017/0307549 A1* | 10/2017 | Hesselink | G01N 23/20075 |
| 2017/0371045 A1* | 12/2017 | Shindou | G01T 1/2012 |

OTHER PUBLICATIONS

Japan Patent Application No. 2016-119665; Reasons for Refusal; dated Oct. 8, 2019; 7 pages.

* cited by examiner

LAMINATED SCINTILLATOR PANEL

This application claims priority under 35 U.S.C. § 119 to Japanese Patent Application No. 2016-119665 filed on Jun. 16, 2016, the entire disclosure of which is incorporated herein by reference.

TECHNOLOGICAL FIELD

The present invention relates to laminated scintillator panel expected to be used in a next-generation Talbot system.

BACKGROUND

Currently, in X-ray image diagnosis, an absorption image that images attenuation of an X-ray after passing through an object is used. On the other hand, since X-rays are a type of electromagnetic waves, attention is paid to this wave nature, and attempts to image changes in the phase after X-rays have passed through an object have been made in recent years. These are called an absorption contrast and a phase contrast, respectively. The imaging technique using such a phase contrast is considered to have a high sensitivity to soft tissues of a human body containing a lot of these because the sensitivity to light elements is higher than a conventional absorption contrast.

However, since a conventional phase contrast imaging technique needs the use of a synchrotron X-ray source or a minute focus X-ray tube, it has thought to be difficult for them to be in practical use in general medical facilities because the former needs to have a huge facility and the latter cannot secure sufficient X-ray dose to photograph a human body.

In order to solve this problem, X-ray image diagnosis (Talbot system) using an X-ray Talbot-Lau interferometer capable of acquiring a phase contrast image using an X-ray source conventionally used in a medical field is expected.

As shown in FIG. 2, a Talbot-Lau interferometer has a G0 lattice, a G1 lattice, and a G2 lattice each disposed between a medical X-ray tube and an FPD, and visualizes refraction of X-rays by a subject as moire fringes. X-rays are irradiated in a longitudinal direction from an X-ray source disposed in an upper portion and reach an image detector through G0 lattice, subject, G1 lattice, and G2 lattice.

As a manufacturing method of a lattice, for example, a method is known in which a silicon wafer having high X-ray transmissivity is etched to provide lattice-shaped recesses and heavy metals having high X-ray shielding properties are filled therein.

However, with the above method, it is difficult to increase the area due to available silicon wafer size, etching apparatus restriction, or the like, and an object to be photographed is limited to a small part. It is not easy to form a deep recess in a silicon wafer by etching, and it is also difficult to evenly fill metal to the bottom of the recess, and therefore, it is difficult to fabricate a lattice having a thickness enough to sufficiently shield X-rays. For this reason, particularly under high-voltage photographing conditions, X-rays penetrate the lattice, making it incapable of obtaining a favorable image.

On the other hand, it is also studied to adopt a lattice-shaped scintillator having a lattice function added to a scintillator constituting an image detector.

DESCRIPTION OF THE RELATED ART

For example, "Structured scintillator for x-ray grating interferometry" (Paul Scherrer Institute (PSI)) of *Applied Physics Letters* 98, 171107 (2011) discloses a lattice-shaped scintillator in which a groove of a lattice fabricated by etching a silicon wafer is filled with a phosphor (CsI).

However, since, in the above method, a silicon wafer is used as in the above-described method of fabricating a G2 lattice, a situation where the area is restricted or a situation where it is difficult to increase the thickness, which is a problem caused by the silicon wafer, has not been improved. Further, as emission of CsI repeatedly comes to collision on a wall surface of a silicon lattice, the emission thereof is attenuated, which causes a new problem of lowering the luminance.

An object of the present invention is to provide a lattice-shaped laminated scintillator panel with high luminance, a large area, and a thick layer by means completely different from a conventional technique using a silicon wafer.

SUMMARY

To achieve at least one of the abovementioned objects, according to an aspect of the present invention, an image forming apparatus reflecting one aspect of the present invention comprise;

a laminated scintillator panel having a structure in which a scintillator layer for converting radiation into visible light and a non-scintillator layer are repeatedly laminated in a direction parallel to an incident direction of radiation, wherein the non-scintillator layer transmits the visible light.

BRIEF DESCRIPTION OF THE DRAWINGS

The advantages and feature provided by one or more embodiments of the invention will become more fully understood from the detailed description given hereinbelow and the appended drawings which are given by way of illustration only and thus are not intended as a definition of the limit of the present invention.

DETAILED DESCRIPTION OF EMBODIMENTS

Hereinafter, one or more embodiments of the present invention will be described with reference to the drawings. However the scope of the invention is not limited to the disclosed embodiments.

Figure 1:
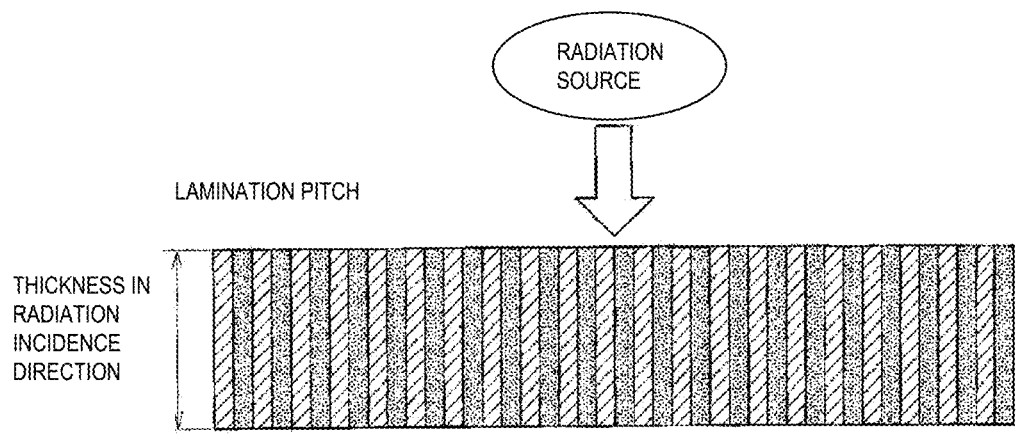
FIG. 1 is a schematic diagram of a laminated scintillator panel.
Figure 2:
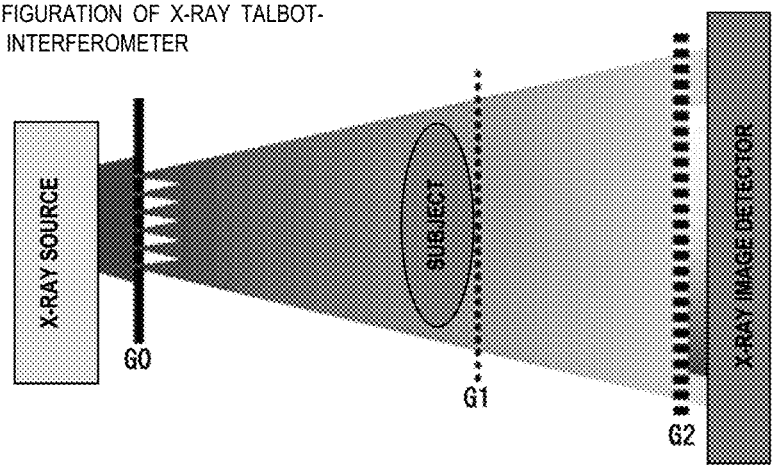
FIG. 2 is a schematic configuration diagram of a Talbot scintillator.

The laminated scintillator of the present invention will be described. As shown in FIG. 1, such a laminated scintillator has a structure in which a scintillator layer and a non-scintillator layer are repeatedly laminated in a direction parallel to the incident direction of radiation.

By facing the radiation incidence surface or the opposite surface of the laminated scintillator panel to a photoelectric conversion panel, the emission of the scintillator by radiation can be converted into an electric signal to acquire a digital image.

Parallel includes almost parallel, and complete parallel and some inclination and curvature are also included in the parallel category of the present invention.

The thickness (hereinafter referred to as lamination pitch) of a pair of a scintillator layer and a non-scintillator layer in the lamination direction and the ratio (hereinafter duty ratio)

of the thickness of the scintillator layer to the thickness of the non-scintillator layer in the lamination direction are derived from Talbot interference conditions, and the lamination pitch is preferably from 0.5 to 200 μm, and more preferably from 0.5 to 50 μm. The duty ratio is preferably from 30/70 to 70/30. In order to obtain a diagnostic image with a sufficient area, it is preferable that the number of repeated lamination layers of the lamination pitch is from 1,000 to 500,000.

The thickness of the laminated scintillator panel of the present invention in the radiation incidence direction is preferably from 10 to 1,000 μm, and more preferably from 100 to 500 μm. When the thickness in the radiation incidence direction is smaller than the lower limit value of the above range, the light emission intensity of the scintillator is weakened, and the image quality is deteriorated. When the thickness in the radiation incidence direction is larger than the upper limit of the above range, the distance of light emitted from the scintillator to a photoelectric conversion panel becomes long, and therefore, light easily diffuses and the sharpness deteriorates.

Scintillator Layer

The scintillator layer in the present invention converts radiation into visible light, is a layer containing a scintillator as a main component, and preferably contains scintillator particles.

As the scintillator according to the present invention, substances capable of converting radiation such as X rays into radiation having different wavelengths such as visible light can be appropriately used. Specifically, scintillators and phosphors described in "Phosphor Handbook" (edited by the Society of Phosphor Synthesis, Ohmsha Ltd., 1987) ranging from page 284 to page 299, substances listed in the web site "Scintillation Properties (http://scintillator.lbl.gov/)" of the US Lawrence Berkeley National Laboratory, or the like may be used, and substances not mentioned here can also be used as scintillators as long as they are "substances capable of converting radiation such as X-rays into radiation having different wavelengths such as visible light".

Specific examples of the composition of the scintillator include the following examples. First, a metal halide phosphor represented by $$M_I X \cdot aM_{II}X'_2 \cdot bM_{III}X''_3 : zA \qquad \text{Basic composition formula (I):}$$

can be mentioned.

In the basic composition formula (I), $M_1$ represents at least one element selected from the group consisting of elements capable of becoming monovalent cations, that is, lithium (Li), sodium (Na), potassium (K), rubidium (Rb), cesium (Cs), thallium (Tl), silver (Ag), and the like.

$M_{II}$ represents at least one element selected from the group consisting of elements capable of becoming divalent cations, that is, beryllium (Be), magnesium (Mg), calcium (Ca), strontium (Sr), barium (Ba), nickel (Ni), copper (Cu), zinc (Zn), cadmium (Cd), and the like.

$M_{III}$ represents at least one element selected from the group consisting of elements belonging to scandium (Sc), yttrium (Y), aluminum (Al), gallium (Ga), indium (In), and lanthanoid.

X, X', and X" each represent a halogen element, and may be different or the same.

A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth). a, b, and z each independently represent a numerical value within the range of $0 \leq a < 0.5$, $0 \leq b < 0.5$, $0 < z < 1.0$.

Rare earth activated metal fluorohalide phosphors represented by $$M_{II}FX : zLn \qquad \text{Basic composition formula (II):}$$

can also be mentioned.

In the basic composition formula (II), $M_{II}$ represents at least one alkaline earth metal element, Ln represents at least one element belonging to the lanthanoid, and X represents at least one halogen element.

z is $0 < z \leq 0.2$.

Rare earth oxysulfide phosphors represented by $$Ln_2O_2S : zA \qquad \text{Basic composition formula (III):}$$

can also be mentioned.

In the basic composition formula (III), Ln represents at least one element belonging to the lanthanoid, and A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth). z satisfies $0 < z < 1$.

In particular, $Gd_2O_2S$ using gadolinium (Gd) as Ln is preferable since it is known to exhibit high emission characteristics in a wavelength region where the sensor panel is most likely to receive light by using terbium (Tb), dysprosium (Dy) or the like as the element type of A.

Metal sulfide-based phosphors represented by $$M_{II}S : zA \qquad \text{Basic composition formula (IV):}$$

can also be mentioned.

In the basic composition formula (IV), $M_{II}$ represents at least one element selected from the group consisting of elements capable of becoming divalent cations, that is, alkaline earth metals, Zn (zinc), Sr (strontium), Ga (gallium), and the like, and A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth). z satisfies $0 < z < 1$.

Metal oxoacid salt-based phosphors represented by $$M_{IIa}(AG)_b : zA \qquad \text{Basic composition formula (V):}$$

can also be mentioned.

In the basic composition formula (V), $M_{II}$ represents a metal element which can be a cation, (AG) represents at least one oxo acid group selected from the group consisting of phosphate, borate, silicate, sulfate, tungstate and aluminate, and A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth).

a and b represent all possible values depending on the valence of the metal and oxo acid groups. z satisfies $0 < z < 1$.

A metal oxide-based phosphor represented by $$M_aO_b : zA \qquad \text{Basic composition formula (VI):}$$

can be mentioned.

In the basic composition formula (VI), M represents at least one element selected from metal elements which can become cations.

A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth).

a and b represent all possible values depending on the valence of the metal and oxo acid groups. z satisfies $0 < z < 1$.

Besides, a metal acid halide-based phosphor represented by $$LnOX : zA \qquad \text{Basic composition formula (VII):}$$

can be mentioned.

In the basic composition formula (VII), Ln represents at least one element belonging to the lanthanoid, X represents at least one halogen element, and A represents at least one element selected from the group consisting of Y, Ce, Pr, Nd, Sm, Eu, Gd, Tb, Dy, Ho, Er, Tm, Yb, Lu, Na, Mg, Cu, Ag (silver), Tl, and Bi (bismuth). z satisfies $0<z<1$.

In a preferable aspect, the scintillator particles contain at least either CsI or $Gd_2O_2S$ as a main component.

The average particle size of the scintillator particles is selected according to the thickness of a scintillator layer in the lamination direction, and is preferably 100% or less, more preferably 90% or less, with respect to the thickness in the lamination direction of the scintillator layer. When the average particle diameter of the scintillator particles exceeds the above range, disturbance of the lamination pitch becomes large and the Talbot interference function decreases.

The content of the scintillator particles in the scintillator layer is preferably 30 vol % or more, more preferably 50 vol % or more, still more preferably 70 vol % or more in consideration of luminescent properties.

Two or more scintillator particles may be contained in the scintillator layer, and two or more scintillator layers containing different scintillator particles may be combined.

Non-Scintillator Layer

The non-scintillator layer in the present invention is a layer that transmits visible light and does not contain a scintillator as a main component, and the content of the scintillator in the non-scintillator layer is less than 10 vol %, preferably less than 1 vol %, and most preferably 0 vol %.

Above all, a material transparent to the emission wavelength of the scintillator is particularly preferable. By using the non-scintillator transparent layer, light emitted from the scintillator propagates not only within the scintillator layer but also into the non-scintillator layer, thereby increasing the amount of light reaching the sensor and improving luminance. The transmittance in the lamination direction of a single layer of the non-scintillator layer is 80% or more, preferably 90%, and still more preferably 95% or more.

Preferably, the non-scintillator layer contains a material having the transmittance as described above as main components, such as the variety of glasses, polymer materials, and the like. These may be used singly or in combination of a plurality of them.

Specifically, plate glass such as quartz, borosilicate glass, or chemically tempered glass; ceramics such as sapphire;

polymers such as: polyester such as polyethylene terephthalate (PET) or polyethylene naphthalate (PEN); aliphatic polyamide such as nylon; aromatic polyamide (aramid); polyimide; polyamide imide; polyether imide; polyethylene; polypropylene; polycarbonate; triacetate; cellulose acetate; epoxy; bismaleimide; polylactic acid; sulfur-containing polymers such as polyphenylene sulfide or polyether sulfone; polyether ether ketone; fluororesin; acrylic resin; or polyurethane;

glass fibers or the like (in particular, fiber reinforced resin sheets including such fibers); or bionanofibers including chitosan, cellulose, or the like can be used.

As the non-scintillator layer, a polymer film is preferable from a viewpoint of handling. A commercially available polymer film may be used, or a polymer film may be formed on a separator film having releasability and then peeled off from the separator film and used. Fine particles of silica or the like may be contained in the polymer film for the purpose of preventing blocking and improving slipperiness during transportation.

In the present invention, a scintillator layer and a non-scintillator layer can be laminated by bonding. The bonding in the present invention means bonding a scintillator layer and a non-scintillator layer together to integrate them. An adhesive layer may be interposed between a scintillator layer and a non-scintillator layer, or an adhesive resin may be contained in a scintillator layer or a non-scintillator layer in advance, so that they may be bonded without interposing an adhesive layer.

An adhesive resin may be contained in either a scintillator layer or a non-scintillator layer, and particularly preferably, a scintillator layer contains an adhesive resin as a binder for scintillator particles. The adhesive resin is preferably a material that is transparent to the emission wavelength of the scintillator so as not to inhibit the propagation of light emitted from the scintillator.

The adhesive resin is not particularly limited as long as the object of the present invention is not impaired, and examples thereof include natural polymers such as proteins such as gelatin, polysaccharides such as dextran, or gum arabic; and synthetic polymeric substances such as polyvinyl butyral, polyvinyl acetate, nitrocellulose, ethylcellulose, vinylidene chloride•vinyl chloride copolymer, poly(meth) acrylate, vinyl chloride vinyl acetate copolymer, polyurethane, cellulose acetate butyrate, polyvinyl alcohol, polyester, epoxy resin, polyolefin resin, and polyamide resin. These resins may be crosslinked with a crosslinking agent such as epoxy or isocyanate, and these adhesive resins may be used singly or in combination of two or more kinds. The adhesive resin may be either a thermoplastic resin or a thermosetting resin.

When an adhesive resin is contained in the scintillator layer, its content is preferably from 1 to 70 vol %, more preferably from 5 to 50 vol %, and still more preferably from 10 to 30 vol %. When the content is lower than the lower limit of the above range, sufficient adhesiveness can not be obtained, and conversely, when the content is higher than the upper limit of the above range, the content of the scintillator becomes insufficient and the amount of luminescence decreases.

The scintillator layer may be formed by coating a composition in which the scintillator particles and an adhesive resin are dissolved or dispersed in a solvent, or may be formed by coating a composition prepared by heating and melting a mixture containing the scintillator particles and an adhesive resin.

When coating the composition in which the scintillator particles and the adhesive resin are dissolved or dispersed in a solvent, examples of usable solvents include: lower alcohols such as methanol, ethanol, isopropanol, and n-butanol; ketones such as acetone, methyl ethyl ketone, methyl isobutyl ketone, and cyclohexanone; esters of lower fatty acids and lower alcohols such as methyl acetate, ethyl acetate, and n-butyl acetate; ethers such as dioxane, ethylene glycol monoethyl ether, and ethylene glycol monomethyl ether; aromatic compounds such as triol and xylene; halogenated hydrocarbons such as methylene chloride and ethylene chloride; and mixtures thereof. A variety of additives such as a dispersant for improving dispersibility of scintillator particles in the composition and a curing agent or a plasticizer for improving the bonding force between an adhesive resin and scintillator particles in a scintillator layer after formation may be mixed in the composition.

Examples of the dispersant used for such purpose include phthalic acid, stearic acid, caproic acid, and lipophilic surfactant.

Examples of the plasticizer include: phosphoric acid esters such as triphenyl phosphate, tricresyl phosphate, and diphenyl phosphate; phthalic acid esters such as diethyl phthalate and dimethoxyethyl phthalate; glycolic acid esters such as ethyl phthalyl ethyl glycolate and butyl phthalyl butyl glycolate; and polyesters of polyethylene glycol and aliphatic dibasic acids such as polyesters of triethylene glycol and adipic acid, and polyesters of diethylene glycol and succinic acid. As the curing agent, a known curing agent for a thermosetting resin can be used.

When heating and melting the mixture containing the scintillator particles and the adhesive resin, it is preferable to use a hot-melt resin as the adhesive resin. As the hot-melt resin, for example, one mainly composed of a polyolefin-based, polyamide-based, polyester-based, polyurethane-based, or acrylic-based resin can be used. Among these, from viewpoints of light permeability, moisture resistance, and adhesiveness, those based on a polyolefin resin as a main component are preferable. As the polyolefin-based resin, for example, ethylene-vinyl acetate copolymer (EVA), ethylene-acrylic acid copolymer (EAA), an ethylene-acrylic acid ester copolymer (EMA), ethylene-methacrylic acid copolymer (EMAA), ethylene-methacrylic acid ester copolymer (EMMA), an ionomer resin or the like can be used. These resins may be used as a so-called polymer blend in which two or more kinds of resins are combined.

There are no particular restrictions on means for coating a composition for forming a scintillator layer, and usual coating means such as a doctor blade, a roll coater, a knife coater, an extrusion coater, a die coater, a gravure coater, a lip coater, a capillary coater, or a bar coater can be used.

Fabrication of Laminated Scintillator Panel

A laminated scintillator panel according to the present invention is fabricated by repeatedly laminating a scintillator layer and a non-scintillator layer, and then joining adjacent layers.

There are no particular restrictions on the method of repeatedly laminating the scintillator layer and the non-scintillator layer, and an individually formed scintillator layer and non-scintillator layer may be divided into a plurality of sheets, and then the divided sheets may be alternately repeatedly laminated.

In the present invention, it is preferable that a plurality of partial laminates in which the scintillator layer and the non-scintillator layer are bonded to each other are formed, and then the plurality of partial laminates are laminated to form the laminate since it is easy to adjust the number of layers and the thickness of the laminate.

For example, a partial laminate composed of a pair of scintillator layer and non-scintillator layer may be formed in advance, the partial laminate may be divided into a plurality of sheets, and the sheets may be laminated repeatedly.

When the partial laminate composed of the scintillator layer and the non-scintillator layer has a film shape that can be wound up, efficient lamination is possible by winding the film on a core. The winding core may be cylindrical or a plate. More efficiently, the repeated laminate of the scintillator layer and the non-scintillator layer fabricated by the above method may be bonded (integrated) by pressurization, heating, or the like, and then divided into a plurality of sheets, and the sheets may be repeatedly laminated.

There is no particular restriction on the method of forming a partial laminate composed of a scintillator layer and a non-scintillator layer, and a scintillator layer may be formed by selecting a polymer film as a non-scintillator layer and coating a composition containing scintillator particles and an adhesive resin on one side thereof. A composition containing scintillator particles and an adhesive resin may be coated on both sides of a polymer film.

As described above, when a partial laminate is formed by coating a composition containing scintillator particles and an adhesive resin on a polymer film, it is possible to simplify a process and to easily divide the partial laminate into a plurality of sheets. The dividing method is not particularly limited, and a usual cutting method is selected.

A transfer substrate coated with a scintillator layer in advance may be transferred onto a film composed of a non-scintillator layer. As needed, the transfer substrate is removed by means such as peeling.

In the present invention, the scintillator layer and the non-scintillator layer are bonded by pressurizing the laminate so that the scintillator layer and the non-scintillator layer are in a direction parallel to the incident direction of radiation.

By heating a repeated laminate of a plurality of scintillator layers and non-scintillator layers in a pressurized state so as to obtain a desired size, the lamination pitch can be adjusted to a desired value.

There is no particular restriction on the method of pressurizing the repeated laminate of the plurality of scintillator layers and the non-scintillator layer to have a desired size, and it is preferable to apply pressure in a state in which a spacer such as a metal is provided in advance so that the laminate is not compressed exceeding a desired size. The pressure at that time is preferably from 1 MPa to 10 GPa. When the pressure is lower than the lower limit of the above range, there is a possibility that a resin component contained in the laminate can not be adjusted to a predetermined size. When the pressure is higher than the upper limit of the above range, a spacer may be deformed, and there is a possibility that the laminate is compressed exceeding a desired size.

By heating the laminate in a pressurized state, bonding can be made more robust.

Depending on the kind of a resin, it is preferable to heat a repeated laminate of a plurality of scintillator layers and non-scintillator layers for about from 0.5 to 24 hours at a temperature equal to or higher than the glass transition temperature for a thermoplastic resin and at a temperature equal to or higher than the curing temperature for a thermosetting resin. The heating temperature is preferably from 40° C. to 250° C. in general. When the temperature is lower than the lower limit of the above range, the fusion or curing reaction of the resin may be insufficient, and there is a possibility of poor bonding or returning to the original size when releasing compression. When the temperature is higher than the upper limit of the above range, there is a possibility that the resin deteriorates and the optical characteristics are impaired. There are no particular restrictions on the method of heating the laminate under pressure, and a press equipped with a heating element may be used, the laminate may be oven-heated in a state of being enclosed in a box-shaped jig so as to have a predetermined size, or a heating element may be mounted on a box-shaped jig.

As a state before a repeated laminate of a plurality of scintillator layers and non-scintillator layers is pressurized, it is preferable that voids exist inside the scintillator layer, inside the non-scintillator layer, or in the interface between the scintillator layer and the non-scintillator layer. When pressure is applied in the absence of any voids, a part of a constituent material flows out from an end face of the laminate to cause disorder in the lamination pitch or return to the original size when releasing the pressure. When a void exists, the void becomes a cushion even when pressurized, and the laminate can be adjusted to an arbitrary size in the range until the void becomes zero, that is, the lamination pitch can be adjusted to an arbitrary value. The porosity is calculated from the following formula using a measured volume (area×thickness) of the laminate and the theoretical volume (weight÷density) of the laminate.

(measured volume of laminate−theoretical volume of laminate)÷theoretical volume of laminate×100

When the area of the laminate is constant, the porosity is calculated from the measured thickness of the laminate and the theoretical thickness (weight/density/area) of the laminate according to the following formula.

(measured thickness of laminate −theoretical thickness of laminate)/theoretical thickness of laminate×100

The porosity of the scintillator layer after heating is preferably 30 vol % or less. When the porosity exceeds the above range, the packing ratio of the scintillator decreases and the luminance decreases.

As means for providing voids in the scintillator layer or the non-scintillator layer, for example, bubbles may be contained in the layer in the process of manufacturing the scintillator layer or the non-scintillator layer, or hollow polymer particles may be added. On the other hand, even when irregularities are present on the surface of the scintillator layer or the non-scintillator layer, the same effect can be obtained since a void is formed at the contact interface between the scintillator layer and the non-scintillator layer. As means for providing irregularities on the surfaces of the scintillator layer or the non-scintillator layer, for example, an irregularity-forming treatment such as a blast treatment or an emboss treatment may be applied to the surface of the layer, or irregularities may be formed on the surface by incorporating a filler in the layer. When a scintillator layer is formed by coating a composition containing scintillator particles and an adhesive resin on a polymer film, irregularities are formed on the surface of the scintillator layer, and voids can be formed at the contact interface with the polymer film. The size of the irregularities can be arbitrarily adjusted by controlling the particle size and dispersibility of the filler.

Since a radiation source emitting radiation such as X-rays is generally a point wave source, when individual scintillator layers and non-scintillator layers are formed completely in parallel, X-rays obliquely enter the peripheral region of a laminated scintillator. As a result, in the peripheral region, so-called vignetting, in which radiation is not sufficiently transmitted, occurs. Vignetting becomes a serious problem as the scintillator becomes larger in area.

This problem can be solved by making, when, in the laminated scintillator panel, the radiation incident side is defined to be a first surface, and the side facing the first surface is defined to be a second surface, the lamination pitch of the scintillator layer and the non-scintillator layer on the second surface larger than the lamination pitch of the scintillator layer and the non-scintillator layer on the first surface to arrange individual scintillator layers and non-scintillator layers in such a way that they are parallel to the radiation. Specifically, this can be realized by bending the laminated scintillator panel or by forming the laminated scintillator panel into an inclined structure without being bent. In the present invention, by making both the first surface and the second surface of the inclined laminated scintillator panel plane, it is possible to make close contact with a photoelectric conversion panel which is rigid and flat in general, which is preferable from a viewpoint improvement of image quality. On the other hand, when the laminated scintillator panel is to be bent, a photoelectric conversion panel needs to follow the laminated scintillator panel, and therefore, a flexible material is preferably used.

Figure 3:
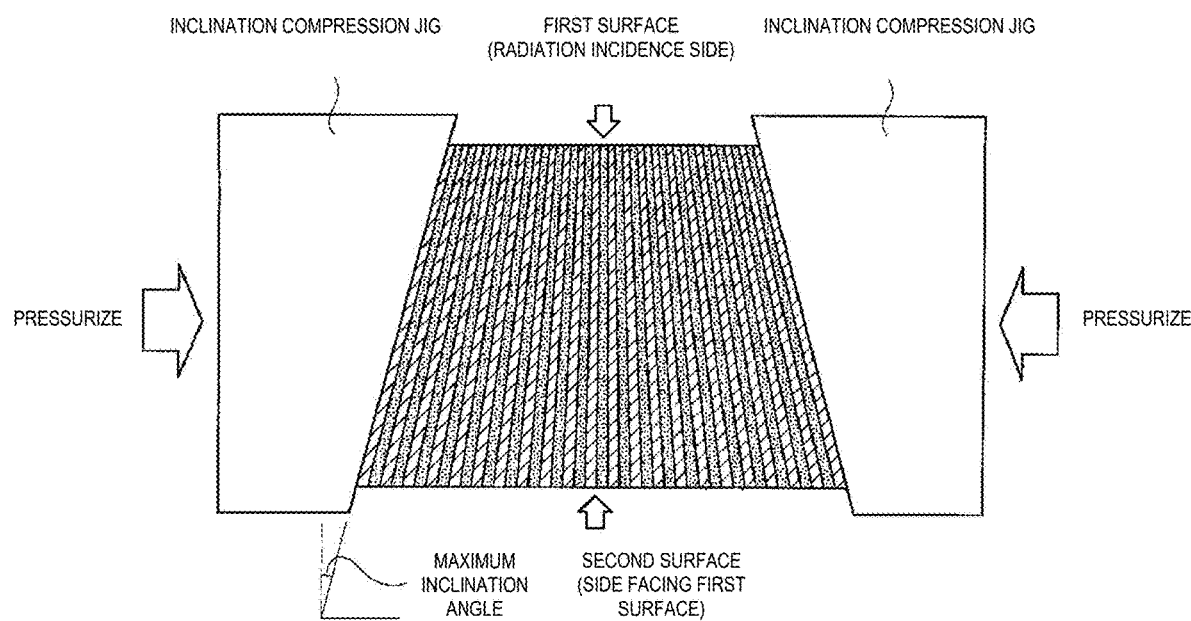
FIG. 3 is a schematic diagram of a laminated scintillator panel with inclination.

In order for the laminated scintillator panel to have an inclined structure, for example, in a step of pressurizing the repeated laminate of the plurality of scintillator layers and non-scintillator layers, the pressurizing direction is made oblique, thereby forming an inclined structure having a trapezoidal cross section. The inclination angle is the maximum at an end side of the laminated scintillator panel, and it becomes continuously close to parallel toward the center. The maximum inclination angle is determined by the size of the laminated scintillator panel or the distance between the laminated scintillator panel and the radiation source, and is usually from 0 to 10°. As a pressurizing method for forming the inclined structure, for example, a pressurizing jig having a predetermined inclination as shown in FIG. 3 is used. The inclination angle 0° means parallel, and the above range is included in the concept of "parallel" in the specification of the present application.

At the interface between the scintillator layer and the non-scintillator layer of the laminated scintillator panel, for the purpose of improving sharpness, a light-shielding layer for suppressing diffusion of light emitted from the scintillator may be provided. The light-shielding layer is not particularly limited as long as it has a function of suppressing propagation of light emitted from the scintillator, and may have, for example, a light-reflecting function, or may have a light-absorbing function.

In order not to significantly impair the luminance, the light-shielding layer is preferably inserted at a ratio of one layer to a lamination pitch of from five layers to 500 layers, and more preferably is inserted at a ratio of one layer to a lamination pitch of from 10 layers to 100 layers. When the lamination pitch falls below the lower limit of a specified value, the sharpness improves but the luminance greatly decreases, and when the lamination pitch exceeds the upper limit, the effect of improving the sharpness is impaired.

Means for providing the light-shielding layer is not particularly restricted, and dye or pigment, or ink containing metal nanoparticles may be applied, or a metal thin film may be provided by a gas phase method such as vapor deposition or sputtering.

In the present invention, it is preferable to planarize a bonding end face where a plurality of scintillator layers and non-scintillator layers are bonded. In particular, scattering of a scintillator light at the bonding end face can be suppressed by planarizing the face on the radiation incidence side, the side opposite thereto, or both sides, thereby improving the sharpness. The planarizing method is not particularly limited, and energy such as ions, plasma, electron beam, or the like may be irradiated in addition to machining such as cutting, grinding, and polishing. In the case of machining, it is preferable to work in a direction parallel to a laminated structure so as not to damage the lamination structure of scintillator layers and non-scintillator layers.

Since the thickness of the laminated scintillator panel in the present invention in the direction of incidence of radiation is as thin as several mm or less, in order to maintain the lamination structure, it is preferable that the surface on the radiation incidence side, the side opposite thereto, or both surfaces are bonded and held on a support.

As the support, a variety of glasses, polymer materials, metals, or the like which can transmit radiation such as X-rays can be used, and examples thereof include: glass sheets such as quartz, borosilicate glass, and chemically tempered glass; ceramic substrates such as sapphire, silicon nitride, and silicon carbide; semiconductor substrates (photoelectric conversion panels) such as silicon, germanium, gallium arsenide, gallium phosphorus, and gallium nitrogen; polymer films (plastic films) such as cellulose acetate films, polyester films, polyethylene terephthalate films, polyamide films, polyimide films, triacetate films, and polycarbonate films; metal sheets such as aluminum sheets, iron sheets, and copper sheets; metal sheets having a coating layer of the metal oxide; carbon fiber reinforced resin (CFRP) sheets; and amorphous carbon sheets. The thickness of the support is preferably from 50 μm to 2,000 μm, and more preferably from 50 to 1,000 μm.

A method of laminating a laminated scintillator panel and a support is not particularly specified, and for example, an adhesive, a double-sided tape, a hot-melt sheet, or the like can be used. After laminating the laminated scintillator panel and the support, the surface opposite to the bonding surface may be planarized.

Between the laminated scintillator panel and the support may be provided a layer that reflects light emitted from the scintillator or a layer that absorbs light emitted from the scintillator depending on an intended use. The luminance is improved by providing a layer that reflects light emitted from the scintillator, and the sharpness is improved by providing a layer that absorbs light emitted from the scintillator. The support itself may have a function of reflecting or absorbing light emitted from the scintillator.

By facing the laminated scintillator panel of the present invention to a photoelectric conversion panel, it is possible to convert light emitted from the scintillator caused by radiation into an electric signal to acquire a digital image. Although the laminated scintillator panel and the photoelectric conversion panel may be faced to each other in a non-contact manner, in order to reduce the optical loss at the interface between the laminated scintillator panel and the photoelectric conversion panel, it is preferable that they are bonded with a transparent material having a refractive index exceeding 1.0 (air). The bonding method of the laminated scintillator panel and the photoelectric conversion panel is not particularly specified, and for example, an adhesive, a double-sided tape, a hot-melt sheet or the like can be used. Depending on purpose and application, the lamination pitch of the scintillator may be made 1/n (n is a natural number) of the pixel pitch of the photoelectric conversion panel, and then the scintillator and the photoelectric conversion panel may be faced to each other so that n times the lamination pitch of the scintillator coincides with the pixel pitch of the photoelectric conversion panel.

According to the present invention as described above, a laminated scintillator panel capable of enlarging the area and increasing the thickness can be provided by a concept completely different from the use of a silicon wafer.

According to the present invention, since the non-scintillator layer transmits visible light, light does not attenuate, so that the luminance does not decrease. This laminated scintillator panel can also have a large area and a thick layer, and the lamination pitch can be arbitrarily adjusted. Therefore, the laminated scintillator panel according to the present invention can be used as a scintillators with lattice function for Talbot-Lau interferometer.

The laminated scintillator panel according to the present invention can be used as a variety of compartmentalized scintillators including Talbot system applications. By changing the scintillator layer of the present invention to a high X-ray absorbing layer containing heavy metal or the like, the panel can be applied to manufacturing methods of a variety of lattices for Talbot such as G0 lattices, G1 lattices, and G2 lattices.

For this reason, high-pressure shooting is also possible, and it is also possible to shoot a thick subject such as a thoracoabdominal part, a thigh part, an elbow joint, a knee joint, or a hip joint.

Conventionally, in diagnostic imaging of cartilage, MRI is the mainstream, and there have been disadvantages of high photographing cost and long photographing time because of using large-scale equipment. On the other hand, according to the present invention, soft tissue such as cartilage, muscle tendon, ligament and visceral tissue can be photographed with a faster X-ray image at lower cost. Therefore, the present invention can be widely applied to orthopedic diseases such as rheumatoid arthritis, osteoarthritis of osteoarthritis, image diagnosis of soft tissue including breast cancer, and the like.

EXAMPLES

Hereinafter, the present invention will be described by way of Examples, but is not limited to the Examples in any way.

Example 1

$Gd_2O_2S$:Tb particles having an average particle diameter of 2 μm and an ethylene-vinyl acetate-based hot-melt resin (Evaflex EV 150 manufactured by Du Pont-Mitsui Polychemicals Co., Ltd., melting point=61° C.) were mixed so that the solid content ratio (volume fraction) was 75/25 to obtain a composition for forming a scintillator layer. This composition was melted at 200° C. and coated on a PET film (non-scintillator layer) having the theoretical film thickness of 3 μm (calculated from the weight) with a die coater so that the theoretical film thickness was 3 μm (calculated from the weight), whereby a partial laminate composed of a scintillator layer and a non-scintillator layer was fabricated. The transmittance of the non-scintillator layer (PET film) before forming the scintillator layer was 98%. Thereafter, the partial laminate was cut to 120 mm×3 mm, and 20,000 sheets were laminated. The measured film thickness of this laminate was 140 mm. Since the theoretical film thickness of this laminate is 120 mm, the porosity is 17%.

Subsequently, the laminate was pressed parallel to the lamination surface under a pressure of 0.2 GPa using a metallic jig so that the thickness of the laminate was 120 mm, and further, the laminate was heated in this state at 100° C. for 1 hour to prepare a laminated block (120 mm×120 mm×3 mm) composed of a partial laminate of 20,000 layers. The porosity of the laminate after pressurization is 0%.

One side (120 mm×120 mm surface) of the above laminated block was planarized by lathe machining, then an epoxy adhesive was applied thereto, and the block was bonded to a CFRP plate having a thickness of 0.5 mm. Thereafter, the laminated block was cut by lathe machining to a thickness of 0.3 mm to obtain a laminated scintillator panel (120 mm×120 mm×0.3 mm).

Example 2

$Gd_2O_2S$:Tb particles having an average particle size of 2 μm and a polyester resin (Byron 200, Tg=67° C., manufactured by Toyobo Co., Ltd.) was mixed in methyl ethyl ketone (MEK) solvent so that the solid content ratio (volume fraction) was 75/25 to obtain a composition for forming a scintillator layer. This composition was coated on a PET film (non-scintillator layer) having a theoretical film thickness of 3 μm (calculated from the weight) used in Example 1 with a die coater so that the theoretical film thickness was 3 μm (calculated from the weight), whereby a partial laminate composed of the scintillator layer and the non-scintillator layer was fabricated. Thereafter, the partial laminate was cut to 120 mm×3 mm, and 20,000 sheets were laminated. The measured film thickness of this laminate was 160 mm. Since the theoretical film thickness of this laminate is 120 mm, the porosity is 33%.

Subsequently, the laminate was pressed parallel to the lamination surface under a pressure of 0.2 GPa using a metallic jig so that the thickness of the laminate was 120 mm, and further, the laminate was heated in this state at 100° C. for 1 hour to prepare a laminated block (120 mm×120 mm×3 mm) composed of a partial laminate of 20,000 layers. The porosity of the laminate after pressurization is 0%.

The above laminated film was processed in the same manner as in Example 1 to obtain a laminated scintillator panel (120 mm×120 mm×0.3 mm).

Example 3

A laminated scintillator panel was fabricated in the same manner as in Example 1 except that the phosphor particles of Example 1 were changed from $Gd_2O_2S$:Tb particles having an average particle diameter of 2 μm to CsI:Tl particles having an average particle size of 2 μm.

Example 4

In Example 1, after laminating 20,000 sheets each obtained by cutting the partial laminate to 120 mm×3 mm, a metal inclined jig with an inclination angle of 2° was used to pressurize the laminate so that the cross section as shown in FIG. 3 has a trapezoidal inclined structure, and further, in this state, by heating at 100° C. for 1 hour, a laminated block (120 mm×120 mm (average value because of inclination)×3 mm) composed of a minimum lamination unit of 20,000 layers was fabricated.

The surface (see FIG. 3) on the radiation incidence side of the above laminated block was planarized by lathe machining, then an epoxy adhesive was applied thereto, and the block was bonded to a CFRP plate having a thickness of 0.5 mm. Thereafter, the laminated block was cut by lathe machining to a thickness of 0.3 mm to obtain a laminated scintillator panel (120 mm×120 mm×0.3 mm).

Comparative Example 1

A laminated scintillator panel was fabricated in the same manner as in Example 1 except that aluminum was vapor-deposited on one side of the PET film of Example 1 in advance. The transmittance of the non-scintillator layer (aluminum vapor-deposited PET film) before forming the scintillator layer was 3%.

Comparative Example 2

A groove having a width of 3 μm and a depth of 0.1 mm was formed at a pitch of 6 μm on the surface of a Si wafer having a thickness of 0.5 mm by an etching process using a photomask. Thereafter, powder of CsI:Tl was placed on the groove and heated and melted at 650° C. to fill the groove with CsI:Tl to obtain a laminated scintillator panel (120 mm×120 mm×0.1 mm). The transmittance of the non-scintillator layer (Si wafer) before forming the scintillator layer was 1%.

<Evaluation of Lamination Pitch>

As a result of observing the surface (120 mm×120 mm surface) of the fabricated laminated scintillator panel with a microscope, it was confirmed that the scintillator layer and the non-scintillator layer were accurately arranged with a lamination pitch of 6 μm in each case.

<Evaluation of Luminance>

The fabricated laminated scintillator panel was set on a CMOS flat panel (X-ray CMOS camera system Shad-o-Box 6K HS manufactured by Rado-icon Corporation), the distance between the laminated scintillator panel and an X-ray tube was set to 172 cm, and then, X-rays with a tube voltage of 60 Kvp were irradiated. From the obtained X-ray image data, the average signal value of the whole surface of the X-ray image was determined to be the luminance of the scintillator panel, and the relative value when the Example 1 was set to 100 was calculated. The in-plane luminance distribution was calculated by the following formula.

luminance distribution=(maximum value in plane−minimum value in plane)÷average value in plane×100(%)

Evaluation results are shown in Table 1.

TABLE 1

|  | Scintillator layer | Non-scintillator layer | Transmittance of non-scintillator layer | Inclined structure | Luminance (relative value) | Luminance distribution |
|---|---|---|---|---|---|---|
| Example 1 | $Gd_2O_2S$/ethylene-vinyl acetate-based hot-melt resin | PET | 98% | None | 100 | 11% |
| Example 2 | $Gd_2O_2S$/polyester resin | PET | 98% | None | 106 | 10% |
| Example 3 | CsI/ethylene-vinyl acetate-based hot-melt resin | PET | 98% | None | 97 | 11% |
| Example 4 | $Gd_2O_2S$/ethylene-vinyl acetate-based hot-melt resin | PET | 98% | Yes | 101 | 1% |

TABLE 1-continued

|  | Scintillator layer | Non-scintillator layer | Transmittance of non-scintillator layer | Inclined structure | Luminance (relative value) | Luminance distribution |
|---|---|---|---|---|---|---|
| Comparative Example 1 | $Gd_2O_2S$/ethylene-vinyl acetate-based hot-melt resin | Al/PET | 3% | None | 28 | 12% |
| Comparative Example 2 | CsI | Si | 1% | None | 16 | 9% |

As shown in Examples 1 to 4, according to the example of the present invention, a laminated scintillator panel with high luminance can be obtained. By providing the inclined structure as in Example 4, the luminance distribution is considerably reduced, and vignetting is suppressed.

Although embodiments of the present invention have been described and illustrated in detail, it is clearly understood that the same is by way of illustration and example only and not limitation, the scope of the present invention should be interpreted by terms of the appended claims.

What is claimed is:

1. A laminated scintillator panel comprising:
    a scintillator layer converting X-ray radiation into visible light, the scintillator layer comprising scintillator particles bound within an adhesive resin; and
    a non-scintillator layer;
    wherein the scintillator layer and the non-scintillator layer are repeatedly laminated in a direction parallel to an incident direction of radiation,
    wherein the non-scintillator layer transmits the visible light and has a transmittance in a lamination direction of at least 80%,
    wherein the ratio of scintillator layer thickness to non-scintillator layer thickness is between 30/70 and 70/30.

2. The laminated scintillator panel according to claim 1, wherein a lamination pitch of the scintillator layer and the non-scintillator layer is from 0.5 to 200 μm.

3. The laminated scintillator panel according to claim 1, wherein the scintillator particles contain at least either CsI or $Gd_2O_2S$ as a main component.

4. The laminated scintillator panel according to claim 1, wherein the non-scintillator layer comprises a polymer film as a main component.

5. The laminated scintillator panel according to claim 1, wherein
    when i) the radiation incident side is defined to be a first surface, and ii) a side facing the first surface is defined to be a second surface,
    a lamination pitch of the scintillator layer and the non-scintillator layer on the second surface is larger than a lamination pitch of the scintillator layer and the non-scintillator layer on the first surface.

6. The laminated scintillator panel according to claim 5, wherein both the first surface and the second surface are planar.

* * * * *